(12) United States Patent
Black

(10) Patent No.: US 8,606,610 B2
(45) Date of Patent: Dec. 10, 2013

(54) BUSINESS PROCESS SIMULATION TESTING FOR BANK BRANCHES USING AVATARS

(75) Inventor: Jonathan S. Black, Dundee (GB)

(73) Assignee: NCR Corporation, Duluth, GA (US)

( * ) Notice: Subject to any disclaimer, the term of this patent is extended or adjusted under 35 U.S.C. 154(b) by 1374 days.

(21) Appl. No.: 12/004,352

(22) Filed: Dec. 20, 2007

(65) Prior Publication Data

US 2009/0164279 A1 Jun. 25, 2009

(51) Int. Cl.
*G06Q 10/00* (2012.01)

(52) U.S. Cl.
USPC .......................................... 705/7.12

(58) Field of Classification Search
USPC .......................................................... 705/10
See application file for complete search history.

(56) References Cited

U.S. PATENT DOCUMENTS

| | | | |
|---|---|---|---|
| 6,381,583 B1 * | 4/2002 | Kenney ........................ | 705/26.8 |
| 7,548,879 B2 * | 6/2009 | Cash et al. ...................... | 705/35 |
| 2002/0113809 A1 * | 8/2002 | Akazawa et al. ............. | 345/706 |
| 2003/0058238 A1 * | 3/2003 | Doak et al. ..................... | 345/419 |
| 2004/0015424 A1 * | 1/2004 | Cash et al. ..................... | 705/35 |
| 2005/0017977 A1 * | 1/2005 | Simpson et al. .............. | 345/473 |
| 2005/0118557 A1 * | 6/2005 | Sumner et al. ................ | 434/118 |
| 2006/0031578 A1 * | 2/2006 | Pelletier ........................ | 709/245 |
| 2007/0288300 A1 * | 12/2007 | VanDenBogart et al. ...... | 705/10 |
| 2008/0163054 A1 * | 7/2008 | Pieper et al. .................. | 715/706 |
| 2009/0055754 A1 * | 2/2009 | Finn et al. ..................... | 715/757 |
| 2009/0070771 A1 * | 3/2009 | Yuyitung et al. .............. | 718/105 |
| 2009/0112541 A1 * | 4/2009 | Anderson et al. ............. | 703/11 |
| 2009/0113314 A1 * | 4/2009 | Dawson et al. ............... | 715/757 |

FOREIGN PATENT DOCUMENTS

WO    WO 2007016384 A2 *  2/2007    ............. G06Q 30/00

OTHER PUBLICATIONS

Paul, Giaglis, Hlupic; Simulation of Business Processes; Aug. 1999, The American Behavioral Scientist, p. 1551-1576.*
Aguilar; Business Process Simulation: a Fundamental Step Supporting Process Centered Management; 1999 Winter Simulation Conference.*
Tarumi, Matsuyama, Kambayashi; Evolution of Business Processes and a Process Simulation Too', APSEC, Software Engineering Conference.*
Shawver; Virtual Actors and Avatars in a Flexible User-Determined-Scenario Environment, 1997, Virtual Reality Annual International Symposium.*
Aguilar, Business Process Simulation: A Fundamental Step Supporting Process-Centered Management, 1999 Winter Simulation Conference, pp. 1383-1392.*
Tarumi, Evolution of Business Processes and a Process Simulation Tool, Department of Social Informatics, p. 180-187.*

* cited by examiner

*Primary Examiner* — Jason Dunham
*Assistant Examiner* — Venay Puri
(74) *Attorney, Agent, or Firm* — Michael Chan

(57) ABSTRACT

Method and systems for testing services are described which use a virtual world. Observational data is extracted from the virtual world and input to the service. The output of the service is observed and/or may be fed back into the virtual world and its effects observed in the virtual world.

12 Claims, 3 Drawing Sheets

BUSINESS PROCESS SIMULATION TESTING FOR BANK BRANCHES USING AVATARS

TECHNICAL FIELD

The present invention relates to methods of testing services which use real world observational data. It is particularly related to, but in no way limited to, testing services which respond to the observational data in order to improve customer interactions and customer satisfaction.

BACKGROUND

Services are being developed which take real world observational data as inputs. Examples of such observational data include local weather, the numbers of people in particular locations, the movement of those people and in some cases, the identity of those people. It is hard to test these services because the real world observational data is required.

One testing solution is to use a pilot environment, however, there is considerable management overhead associated with setting up and controlling scenarios which are performed in this pilot environment and also it is difficult to capture what actually happened during the scenarios. The logistics of setting up the pilot environment, organizing people to performed scripted scenarios etc can also be problematic. It is also difficult to replay scenarios in a pilot environment because the people may not act in exactly the same manner twice.

Another testing solution is to use a proprietary simulator. These simulators are purpose built for particular scenarios and are generally restricted in terms of their visual representation of the scenarios. It is expensive, complicated and time-consuming to set up these proprietary simulators which must be re-written for new scenarios.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Methods and systems for testing services are described which use a virtual world. Observational data is extracted from the virtual world and input to the service. The output of the service is observed and/or may be fed back into the virtual world and its effects observed in the virtual world.

A first aspect provides a method of testing a service comprising: extracting observational data from a virtual world; inputting the data to the service; and observing an output of the service.

The step of observing an output of the service may comprise: feeding the output back into the virtual world; and observing the virtual world.

The method may further comprise, prior to extracting observational data: defining an environment in the virtual world.

The method may further comprise, prior to extracting observational data: defining a behavior of at least one element in the virtual world.

The method may further comprise: storing the observational data extracted from the virtual world.

The step of inputting the data to the service may comprise: processing the observational data to create event data; and inputting the event data to the service.

The observational data may be processed in an intermediate service to create the event data.

The service may comprise one of a branch management service and a targeted marketing service.

The method may further comprise: providing client data to the service.

A second aspect provides a computer program comprising computer program code means adapted to perform all the steps of any of the methods described above when said program is run on a computer.

The computer program may be embodied on a tangible computer readable medium.

A third aspect provides one or more tangible device-readable media with device-executable instructions for performing steps comprising: extracting observational data from a virtual world; inputting the data to the service; and observing an output of the service.

A fourth aspect provides a system for testing a service comprising: a virtual world; an avatar tracking system; and a system running the service, wherein the avatar tracking system is arranged to extract observational data from the virtual world and feed the data to the service.

The system running the service may be arranged to feed output data from the service back into the virtual world.

Many of the attendant features will be more readily appreciated as the same becomes better understood by reference to the following detailed description considered in connection with the accompanying drawings. The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
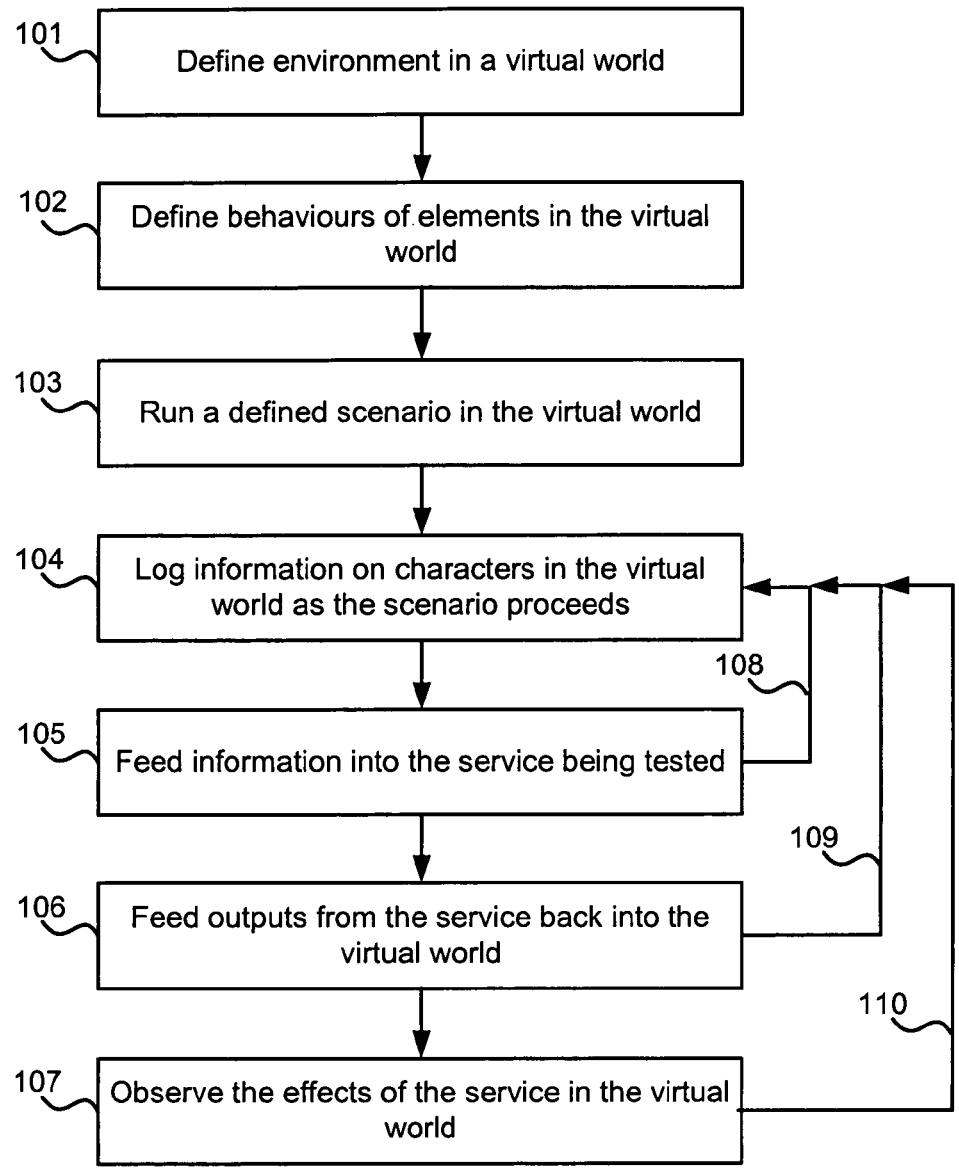
FIG. 1 shows a flow diagram of an improved method of testing services which rely upon real world observational data.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved.

FIG. 1 shows a flow diagram of an improved method of testing services which rely upon real world observational data. This method of testing uses a virtual world. A virtual world is a computer-based simulated environment which provides a graphical rich social environment. Users inhabit such a world and interact with others using their avatars (which are computer representations of users). Examples of virtual worlds include Second Life, There and Active Worlds. The virtual world may include the ability to design elements within the world and to apply scripts to these elements to specify how they should behave. When testing a service using a virtual world, observational data from the virtual world is used instead of the real world observational data.

Initially, an environment within the virtual world may be defined (block 101). This environment may be a 3D representation or may be defined in terms of a 2D representation, such as a floor plan. These environments may include items with which avatars may interact, such as kiosks or self-service terminals. The operation of these items can also be defined (block 102) and this may be done using a scripting interface provided by the virtual world. A defined scenario can then be run (block 103) in this defined environment with items which have defined behavior. The avatars which interact in this defined scenario may be controlled by real people or alternatively may be bots (i.e. intelligent agents). In some scenarios, some of the avatars may be under human control and others may be bots.

Whilst the scenario runs, information on the characters in the virtual world (i.e. information on the avatars) is logged (block 104). The data that is logged (in block 104) is fed into the service being tested (block 105) and the resultant operation of the service observed. In the example of FIG. 1, this observation of the service is performed by feeding outputs from the service back into the virtual world (block 106) and observing the effects of the service in the virtual world (block 107). In other examples, as described below, the operation of the service in response to the particular observational data received may be observed through analysis of metrics or other output from the service. In further examples, the operation of the service may be observed through feedback from the human controllers of avatars taking part in the scenario (i.e. customer or user feedback).

FIG. 1 shows various loop-backs (arrows 108-110) to indicate that elements of the method may be repeated or performed in parallel. The loop-backs shown in FIG. 1 provide just some examples of the manner that elements may be repeated.

The information which is logged (in block 104) may comprise the x,y positions of avatars on the floor plan and may also comprise the identity (e.g. the username) of the particular avatars. Although this information is referred to as being 'logged', which refers to storing the data locally (e.g. within a process for later reference, or within a file or database), in other examples it may be posted (e.g. across a network) to a remote service or file store. The information may be posted to a service which provides the data (e.g. a web service) and may store the data for future use. The service under test may access the data via the service to which the data is posted. The data may be processed prior to providing it to the service under test. In an example, the data may be posted over HTTP to a web service. The service may receive the data as a string which it then parses to generate a data set which is stored in a database (e.g. a MySQL database). In other examples, a secure communications protocol may be used instead of HTTP.

The testing methodology shown in FIG. 1 is less expensive and more practical than use of real world pilot environments. The methodology is also less restrictive than the use of pilot environments because extreme situations can be analyzed which might be impossible (e.g. unsafe) in a pilot environment. The methodology also enables testing of environments which do not exist in the real world yet. This enables simulation of environments prior to the financial commitment of creating the environment itself (e.g. for branch effectiveness modeling). The methodology also provides the ability to accurately replay and modify scenarios. It is possible to change aspects of the scenario and then replay the scenario to see the effect of the particular change—this is much harder in a pilot environment because replaying the same scenario in exactly the same way is infeasible. Virtual worlds also provide a means for gathering accurate metrics describing scenarios.

The testing methodology is lower cost and more flexible than use of a proprietary simulator. Furthermore, the virtual world provides a very high quality graphical representation of the service and its outputs. This makes assessment of the operation of the service very intuitive (as described below). Existing tools within the virtual world may be used for some aspects of the methodology, resulting in faster testing and lower cost testing.

Due to the flexibility (and reduced cost) of the testing methodology described above and shown in FIG. 1, it is possible to assess the suitability of elements of a particular service before committing to development.

As virtual worlds are graphically very rich (e.g. they have high quality 3D rendering and 3D viewing tools), it is very easy and intuitive for someone to observe the effects of a service and a particular scenario on the environment and the users of the service. The observer can pan and zoom around the environment, can view the situation as if they were one of the customers etc. Where the output of the service is graphical material which is shown to the customer (as described in an example below), it enables an observer to view the output and performance of the service in the same manner as the real life customer will.

Whilst the above example referred to the testing of a service, aspects of the environment may also be tested using the methodology described above. In such an instance, aspects of the environment (as defined in block 101) may be changed and the service left the same. This allows the testing of suitability of particular physical designs in combination with particular services. Such testing may not be possible with the known testing methodologies because of their inflexibility, expense and large overheads.

The method of FIG. 1 shows the 'observational data' logged in the virtual world being used directly by the service being tested. However, in other examples, this logged data may be used by an intermediate service which provides inputs into the service which is being tested. These two situations are shown in FIGS. 2 and 3 which show the information which may be input to the virtual world and to services under test.

Figure 2:
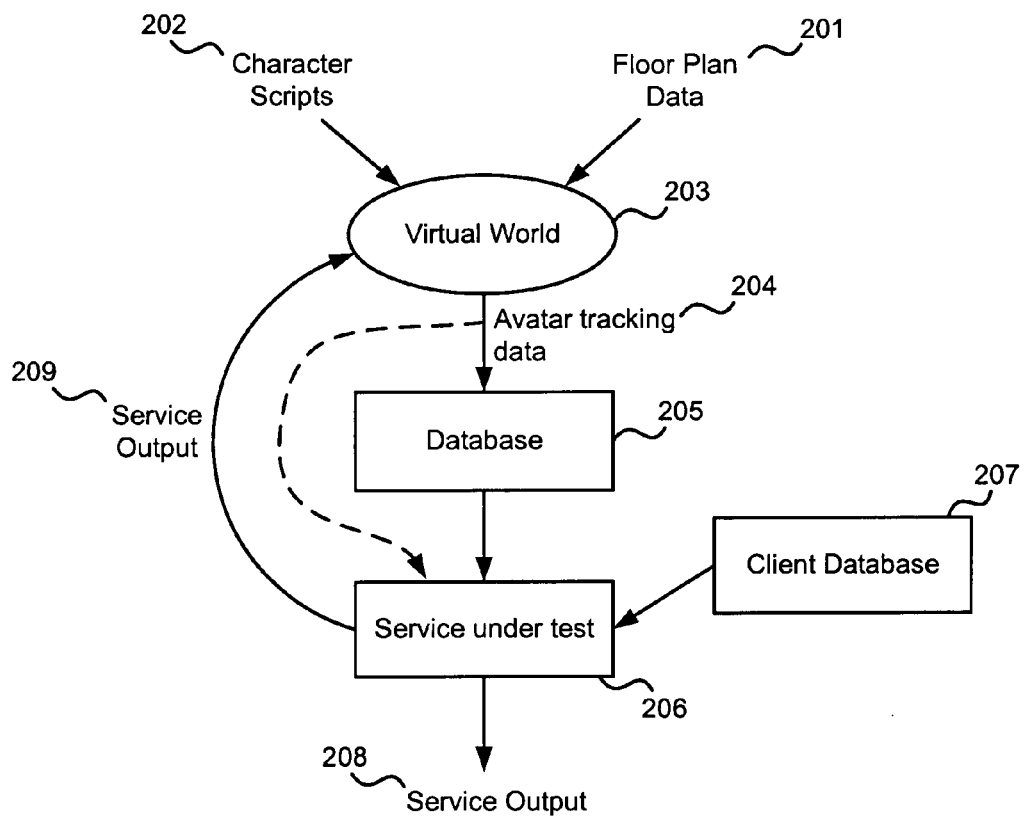
FIG. 2 shows the flow of information in a testing situation which corresponds to that shown in FIG. 1.
Figure 3:
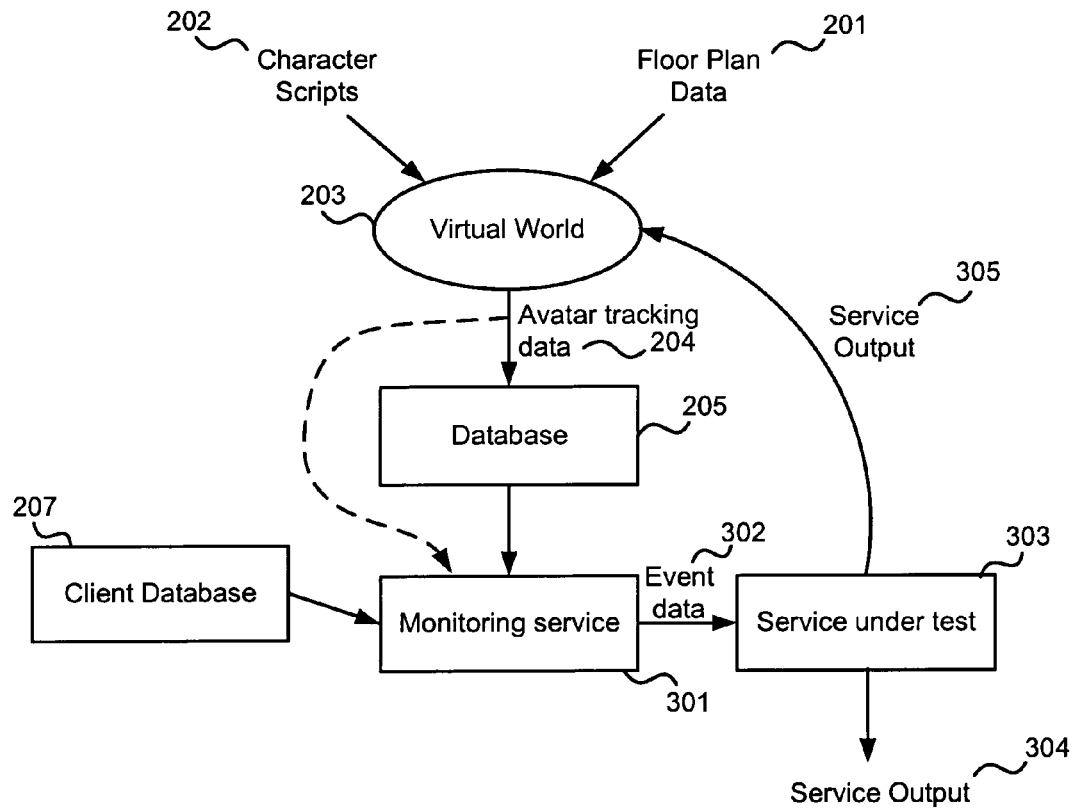
FIG. 3 shows the flow of information for a situation where there is an intermediate service which processes the observational data.

FIG. 2 shows the flow of information in a testing situation which corresponds to that shown in FIG. 1 and described above. Data which defines the environment in the virtual world, such as floor plan data 201, and data which defines the behaviors of elements in the virtual world, such as character scripts 202, are fed into the virtual world 203. Avatar tracking data 204 is extracted from the virtual world 203 and may be stored in a database 205 or input directly into the service under test 206. The service under test 206 may have other inputs, such as a database of clients 207. The output 208, 209 from the service may be observed directly (output 208) or may be fed back into the virtual world (output 209) and the effect of the service may be viewed in the virtual world itself.

In an example, the service under test 206 may be an intelligent management system for a branch of a financial institution (such as a bank or building society) which may, for example, identify the numbers of tellers required. The floor plan data 201 may be a floor plan of the branch and the character scripts 202 may include the scripts to be followed by the human controlled avatars, which may represent the customers to the branch, and/or the scripts to be followed by the bots, which may represent the tellers or other branch staff. In this example, the avatar tracking data may include the number and locations of customers within the branch. The data may also include some identity information so that the service can determine whether the customers in the branch are new or existing customers of the particular financial institution. The output of the service may be to provide a suggested number of tellers for a given situation. Where this information is fed back into the virtual world (output 209), this may trigger additional tellers to appear (e.g. additional bots acting as tellers) and it may then be possible to visually observe the effect in the branch, e.g. to observe queue lengths in the virtual world.

In addition to reacting to the current environment, the service under test may also use historical data of customer activities (which may also be accessed from the database 205). This enables the service under test to make strategic decisions (e.g. to predict the types of skills that should be available at certain times of the day and a total number of employees to have available).

FIG. 3 shows the flow of information for a situation where there is an intermediate service which processes the observational data. In this example, the intermediate service is a monitoring service 301. This monitoring service processes the observational data to determine when specific defined events occur and then outputs the event data 302 to the service under test 303. The inputs to the virtual world 203 may be the same, such as data which defines the environment (e.g. floor plan data 201) and data which defines actions of characters and other elements in the environment (e.g. character scripts 202). The monitoring service has the avatar tracking data 204 as an input (either directly or via a database 205 in which the tracking data is stored) and may also have other inputs, such as a client database 207. The service under test 303 receives the event data 302 from the monitoring service 301 and generates outputs 304, 305 which may be observed directly (output 304) or fed back into the virtual world (output 305) where the effect of the service under test may be observed.

The event data, which is generated by the monitoring service, may be based on entry and exit criteria (e.g. numbers of customers in a branch or particular customers entering a branch) or may use additional environment data provided to it to, for example, identify hotspots within the environment.

In an example, the service under test 303 may be a targeted marketing service, which provides targeting marketing information to a customer either via a kiosk or self-service terminal or through a teller. Where the targeted marketing information is provided via a teller, this would be delivered to a display screen used by the teller who can then communicate the information verbally to the customer. In this example, an event may be triggered when a customer goes up to a kiosk or window at a counter. This event may be determined by the monitoring service which knows where kiosks are and determines from the tracking information where customers are and correlates the two. The monitoring service may also determine information about the customer (e.g. using client database 207) such as whether they are an existing or new customer, the products which are currently used by the customer etc. This event information may be passed to the targeted marketing service which generates advertisements or marketing material specifically for the particular user and tailored to the means by which the information is to be given to the user (e.g. visually at a kiosk or verbally at a window at a counter in the branch). The advertisement or marketing material data generated by the targeted marketing service may be fed back into the virtual world such that the teller (which may be a bot) can provide the information or so that the particular advertisements can be displayed at the kiosk. Where the marketing information is to be provided by a teller it may comprise a script for the teller, a suggested service set to offer the customer etc. An observer in the virtual world can see/hear the targeted marketing information that is being provided to the particular customer and can monitor its effectiveness.

Whilst in the above example, the targeted marking is described as being provided at a kiosk, in other examples the targeted marking information (i.e. an advertisement) may be provided at another location, e.g. on an electronic display board. In an example, hotspots may be defined which relate to locations where targeted marketing may be displayed and events generated when customers are in a hotspot (or when only one customer is located in a particular hotspot). Where multiple customers are in a particular hotspot, the targeted marketing may be determined based on all the multiple customers rather than just based on a single customer.

Other services which may be tested in this way include, but are not limited to, location based marketing services, queue management services, VIP services (e.g. a 'meet and greet' service for particular important clients), branch effectiveness modeling, customer relationship management (CRM) services, dynamic staffing, branch design.

FIGS. 2 and 3 each show a single service being tested, however in other examples more than one service may be tested (e.g. the monitoring service may also be being tested in the arrangement of FIG. 3). Furthermore, whilst FIG. 3 shows only one service feeding data into the service to be tested 303, in other examples there may be multiple services feeding data into the particular service being tested. For example, there may be a monitoring service 301 (as shown in FIG. 3) and a separate identification service which takes information from the monitoring service and identifies the particular customers involved in a notified event.

The elements in FIGS. 2 and 3 are shown connected by unidirectional arrows. However, the flow of data and the communication between elements may, in some cases, be unidirectional (in either direction, not simply the direction indicated by the arrow) or bi-directional.

Although the methods and scenarios described above relate to financial institutions, the methods may be applied to other situations, such as retail situations (e.g. store planning, store effectiveness modeling etc).

FIG. 1, which is described above, includes seven steps however, it will be appreciated that in some embodiments some of the steps may be omitted and/or may be performed in a different order and/or steps may be performed substantially simultaneously.

Where the characters within the virtual world are bots, scenarios can be replayed many times in exactly the same way. This enables changes to be made to the services and the results of these changes monitored. Where the characters are controlled by humans the logged data enables scenarios to be replayed exactly, at least until the point that the service effects a change in the environment to which the human controller of the avatar can then react to. In such a situation, the avatars may initially be computer controlled (like bots) but control may subsequently pass back to a human. In another example, where the characters are controlled by humans during replay, the tracking data may be analyzed to determine whether the characters are operating within defined bounds (e.g. any difference in character activity between the initial play and the replay is not significant).

The testing, as described above, may be performed within a controlled environment in a virtual world (e.g. within a private island in the world) or within an uncontrolled environment. Additionally, whilst in some examples the humans controlling the avatars may be provided with scripts or other instructions to follow, in other examples the humans (and their avatars) may be uncontrolled. This provides as close to real-life simulation of a service because the behavior of, for example, a customer in a store or branch, is not known and cannot be predicted.

Any range or device value given herein may be extended or altered without losing the effect sought, as will be apparent to the skilled person. It will be understood that the benefits and advantages described above may relate to one embodiment or may relate to several embodiments. It will further be understood that reference to 'an' item refer to one or more of those items.

The term 'comprising' is used herein to mean including the method blocks or elements identified, but that such blocks or elements do not comprise an exclusive list and a method or apparatus may contain additional blocks or elements.

It will be understood that the above description of a preferred embodiment is given by way of example only and that various modifications may be made by those skilled in the art. The above specification, examples and data provide a complete description of the structure and use of exemplary embodiments of the invention. Although various embodiments of the invention have been described above with a certain degree of particularity, or with reference to one or more individual embodiments, those skilled in the art could make numerous alterations to the disclosed embodiments without departing from the spirit or scope of this invention.

The methods described herein may be performed by software in machine readable form on a tangible storage medium. The software can be suitable for execution on a parallel processor or a serial processor such that the method steps may be carried out in any suitable order, or simultaneously. This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

What is claimed is:

1. A method of operating a virtual world in combination with an avatar tracker and an intelligent bank branch manager to provide an output which can be observed at the virtual world, the method comprising:

receiving, by the virtual world, floor plan data which is representative of a floor plan of a virtual bank branch environment within the virtual world;

receiving, by the virtual world, a first set of avatar data which is representative of behavior of a first set of avatars which represent bank customers within the virtual bank branch environment within the virtual world;

electronically by a processor of the avatar tracker, tracking a number and locations of avatars of the first set of avatars in the floor plan of the virtual bank branch environment within the virtual world, wherein the number and locations of avatars of the first set of avatars is based upon the first set of avatar data which is representative of behavior of the first set of avatars which represent bank customers within the virtual bank branch environment within the virtual world;

electronically by a processor of the intelligent bank branch manager, identifying a suggested number of avatars of a second set of avatars which represent bank tellers within the virtual bank branch environment within the virtual world, wherein the suggested number of avatars of the second set of avatars is based upon the tracked number and locations of avatars of the first set of avatars in the floor plan of the virtual bank branch environment within the virtual world;

receiving, by the virtual world, from the intelligent bank branch manager the suggested number of avatars of the second set of avatars which represent bank tellers within the virtual bank branch environment within the virtual world; and outputting, by the virtual world, an output which is representative of bank customer queue length which can be observed at the virtual world, wherein the output representative of bank customer queue length is based upon the suggested number of avatars of the second set of avatars received from the intelligent bank branch manager.

2. A method of operating a virtual world in combination with an avatar tracker and an intelligent bank branch manager to provide an output which can be observed at the intelligent bank branch manager, the method comprising:

receiving, by the virtual world, floor plan data which is representative of a floor plan of a virtual bank branch environment within the virtual world;

receiving, by the virtual world, a first set of avatar data which is representative of behavior of a first set of avatars which represent bank customers within the virtual bank branch environment within the virtual world;

electronically by a processor of the avatar tracker, tracking a number and locations of avatars of the first set of avatars in the floor plan of the virtual bank branch environment within the virtual world, wherein the number and locations of avatars of the first set of avatars is based upon the first set of avatar data which is representative of behavior of the first set of avatars which represent bank customers within the virtual bank branch environment within the virtual world;

electronically by a processor of the intelligent bank branch manager, identifying a suggested number of avatars of a second set of avatars which represent bank tellers within the virtual bank branch environment within the virtual world, wherein the suggested number of avatars of the second set of avatars is based upon the tracked number and locations of avatars of the first set of avatars in the floor plan of the virtual bank branch environment within the virtual world; and outputting, by the intelligent bank branch manager, an output which can be observed at the intelligent bank branch manager, wherein the output comprises the suggested number of avatars of the second set of avatars which represent bank tellers within the virtual bank branch environment within the virtual world.

3. A method according to claim 1, further comprising:
electronically by a processor of the avatar tracker, tracking identity information associated with each avatar of the first set of avatars in the floor plan of the virtual bank branch environment within the virtual world, wherein the suggested number of avatars of the second set of avatars is also based upon the tracked identity information of avatars of the first set of avatars in the floor plan of the virtual bank branch environment within the virtual world.

4. A method according to claim 3, further comprising:
electronically by a processor of the intelligent bank branch manager, determining whether each avatar of the first set of avatars is a new bank customer based upon the tracked identity information associated therewith.

5. A method according to claim 3, further comprising:
electronically by a processor of the intelligent bank branch manager, determining whether each avatar of the first set of avatars is an existing bank customer based upon the tracked identity information associated therewith.

6. A method according to claim 3, further comprising:
electronically by a processor of the intelligent bank branch manager, determining whether each avatar of the first set of avatars is a new bank customer based upon the tracked identity information associated therewith; and
electronically by a processor of the intelligent bank branch manager, determining whether each avatar of the first set of avatars is an existing bank customer based upon the tracked identity information associated therewith.

7. A method according to claim 2, further comprising:
electronically by a processor of the avatar tracker, tracking identity information associated with each avatar of the first set of avatars in the floor plan of the virtual bank branch environment within the virtual world,
wherein the suggested number of avatars of the second set of avatars is also based upon the tracked identity information of avatars of the first set of avatars in the floor plan of the virtual bank branch environment within the virtual world.

8. A method according to claim 7, further comprising:
electronically by a processor of the intelligent bank branch manager, determining whether each avatar of the first set of avatars is a new bank customer based upon the tracked identity information associated therewith.

9. A method according to claim 7, further comprising:
electronically by a processor of the intelligent bank branch manager, determining whether each avatar of the first set of avatars is an existing bank customer based upon the tracked identity information associated therewith.

10. A method according to claim 7, further comprising:
electronically by a processor of the intelligent bank branch manager, determining whether each avatar of the first set of avatars is a new bank customer based upon the tracked identity information associated therewith; and
electronically by a processor of the intelligent bank branch manager, determining whether each avatar of the first set of avatars is an existing bank customer based upon the tracked identity information associated therewith.

11. A method according to claim 1, further comprising:
receiving, by the virtual world, a second set of avatar data which is representative of behavior of the second set of avatars which represent bank tellers within the virtual bank branch environment within the virtual world.

12. A method according to claim 2, further comprising:
receiving, by the virtual world, a second set of avatar data which is representative of behavior of the second set of avatars which represent bank tellers within the virtual bank branch environment within the virtual world.

* * * * *